United States Patent
Taguchi et al.

(10) Patent No.: US 6,323,644 B1
(45) Date of Patent: Nov. 27, 2001

(54) ROTATION SENSOR

(75) Inventors: Motohisa Taguchi; Izuru Shinjo; Yuji Kawano; Tatsuya Fukami; Kazuhiko Tsutsumi; Ikuya Kawakita, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/422,973

(22) Filed: Oct. 22, 1999

(30) Foreign Application Priority Data

Apr. 13, 1999 (JP) .................................................. 11-105926

(51) Int. Cl.[7] .............................. G01R 7/30; G01R 33/06
(52) U.S. Cl. ................ 324/207.21; 324/252; 324/207.25
(58) Field of Search ........................... 324/207.12, 207.2, 324/207.21, 207.25, 225, 252, 260; 338/32 R (56) References Cited

U.S. PATENT DOCUMENTS 6,169,396 * 1/2001 Yokotani et al. ................ 324/207.21

FOREIGN PATENT DOCUMENTS

| | | |
|---|---|---|
| 44 08 274 A1 | 9/1994 | (DE) . |
| 44 34 912 A1 | 4/1996 | (DE) . |
| 196 22 040 A1 | 12/1996 | (DE) . |
| 196 47 320 A1 | 12/1997 | (DE) . |
| 197 32 632 A1 | 9/1998 | (DE) . |
| 0 685 746 A2 | 12/1995 | (EP) . |
| 3-52111 | 3/1991 | (JP) . |

OTHER PUBLICATIONS

Japanese Journal of the Applied Magnetism, vol. 15, No. 41991, pp. 813–821.

* cited by examiner

*Primary Examiner*—Jay Patidar
(74) *Attorney, Agent, or Firm*—Sughrue, Mion, Zinn, Macpeak & Seas, PLLC (57) ABSTRACT

The present invention improves the sensitivity and expands the temperature range of operation of a magnetic detection device used in conjunction with rotary shafts such as those found in automobiles. A magnetic detection element consists of a giant magnetoresistance element and an integrated circuit for performing a predetermined operational processing based on the variation of magnetic field detected by the giant magnetoresistance element, and the magnetic detection element is operated in the magnetic field in the range of exceeding the magnetic field for maximizing the resistance value of the giant magnetoresistance element and below the field obtained by multiplying the saturation magnetic field of the giant magnetoresistance element by 0.8.

8 Claims, 13 Drawing Sheets

ROTATION SENSOR

BACKGROUND OF THE INVENTION

1. Field of the Invention

The present invention relates to a magnetoresistance element for detecting a variation of magnetic field and particularly relates to a magnetic detection element which is provided with a giant magnetoresistance element with high level output, method of production of it and magnetic detection device.

2. Description of the Prior Art

Generally speaking, a magnetoresistance element (hereinafter relate to MR element) is an element whose resistance value changes depending on an angle between a magnetization direction of a thin film consisting of a ferromagnetic substance (e.g. Ni—Fe, Ni—Co, etc.) and a direction of electric current.

Resistance of the MR element as above takes a minimum value when an electric current direction and magnetization direction intersects at right angle and takes a maximum value when angle between electric current direction and magnetization direction becomes zero: i.e., both of directions are the same or reversed each other completely. Such a change of resistance value is referred to MR change rate and generally Ni—Fe and Ni—Co takes a rate of 2~3% and 5~6% respectively.

Figure 9:
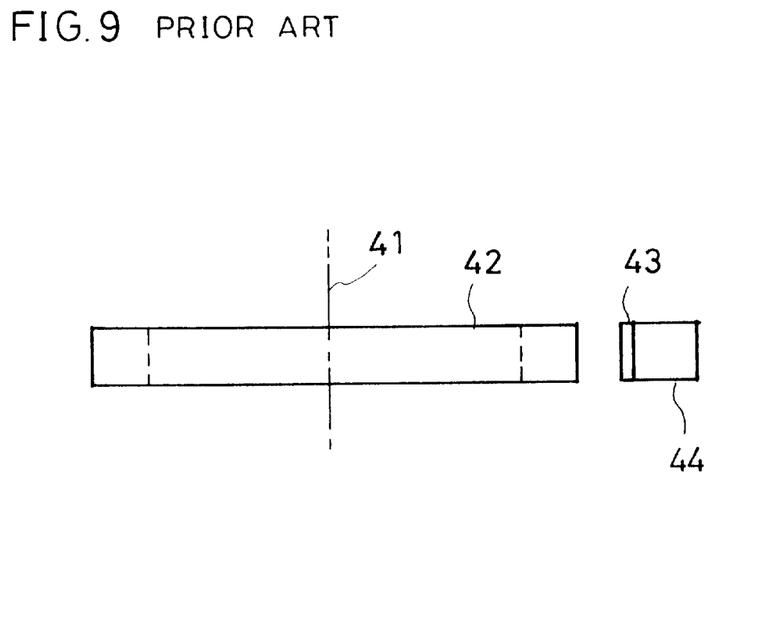
FIG. 9 is a side view showing an arrangement structure of a conventional magnetic detection device.
Figure 10:
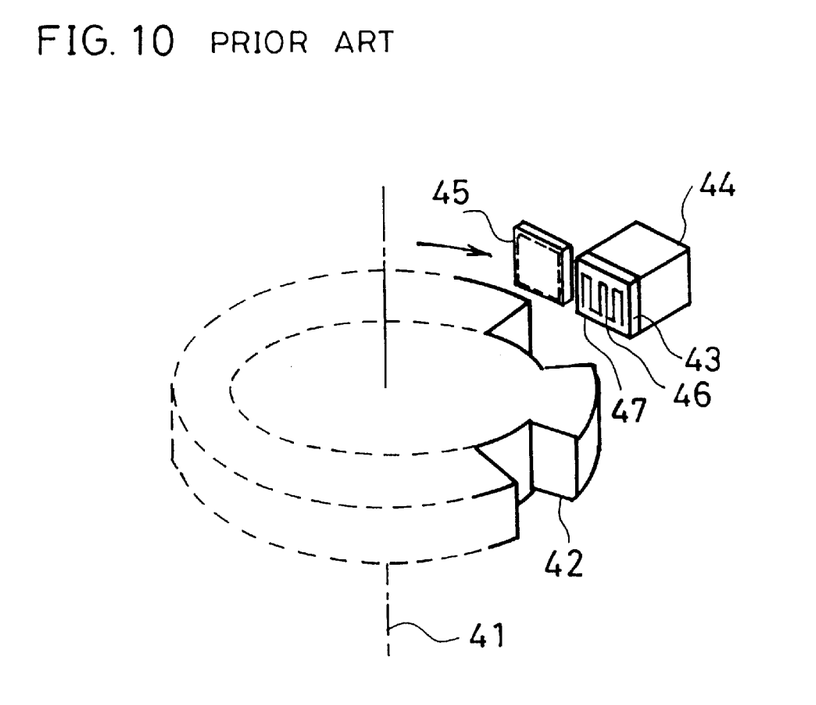
FIG. 10 is a perspective view showing an arrangement structure of a conventional magnetic detection device.

FIG. 9 and FIG. 10 are a side view and a perspective view respectively showing a structure of a conventional magnetic detection device.

As shown by FIG. 9, a conventional magnetic detection device is provided with a rotation shaft 41, a disk shaped magnetic rotating body having at least one or more of uneven face of recess and protrusion on its periphery and rotating synchronously with a rotation of the rotation shaft 41, a MR element 43 which is arranged with a gap having a predetermined distance with the periphery of the rotating body, a magnet 44 fixed to the back side of the MR element 43 for supplying a magnetic field to the MR element 43 and an integrated circuit 45 for processing an output of the MR element 43; and the MR element 43 consists of a magnetic resistance pattern 46 and a thin film surface 47(magnetosensitive surface).

In the foregoing magnetic detection device, the magnetic field penetrating through to thin film surface 47, i.e. a magnetosensitive surface of the MR element 43 changes due to the rotation of the magnetic body 42, thereby the resistance value of the magnetic pattern 46 changes.

However, the output level of the MR element 43 used for the magnetic detection device as above is low and therefor a detection with high accuracy can not be performed. In order to overcome this problem, recently a magnetic detection element employing a giant magnetoresistance element (hereinafter refer to as GMR element) with a high level output has been proposed.

Figure 11:
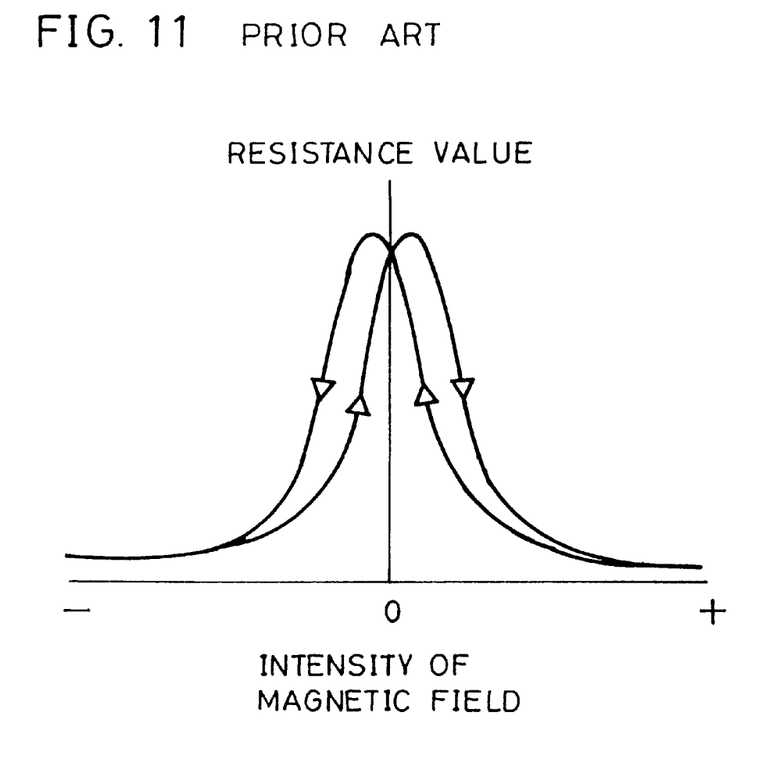
FIG. 11 show characteristics of a conventional GMR element.

FIG. 11 shows characteristics of a conventional GMR element.

The GMR element exhibiting the characteristics shown by FIG. 11 is a laminated layers member acting as so called an artificial lattice membrane arranged in lamination of an alternate succession of a magnetic layer having a thickness of several Å to several tens Å and a non magnetic layer (Fe/Cr, and permalloy/Cu/Co/Cu, Co/Cu, FeCo/Cu) which is disclosed by an article bearing a title of "magnetoresistance effect of an artificial lattice" appearing in Journal of Japanese Applied Magnetism, Vol.15, No,51991, pp.813~821. This laminated member has an extraordinarily high MR effect (MR change rate) comparing with the MR element as mentioned above and also is possible to obtain the same change of resistance regardless of direction of external magnetic field with respect to electric current.

In order to detect a change of magnetic field, carrying out formation of a substantial magnetosensitive surface using a GMR element, formation of electrode on each end of the magnetosensitive surface and forming a bridge circuit between these ends, connecting a power supply for a constant voltage and a constant current between two electrodes facing each other, and converting change of resistance value of the GMR element to change of voltage and then it is possible to arrange the detection of change of magnetic field being acted on the GMR element.

Figure 12:
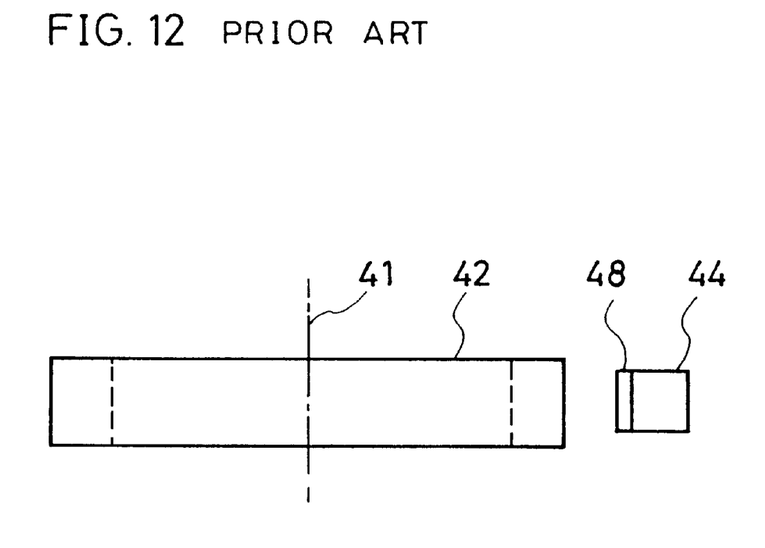
FIG. 12 is a side view showing an arrangement of a magnetic detection device using a conventional GMR element.
Figure 13:
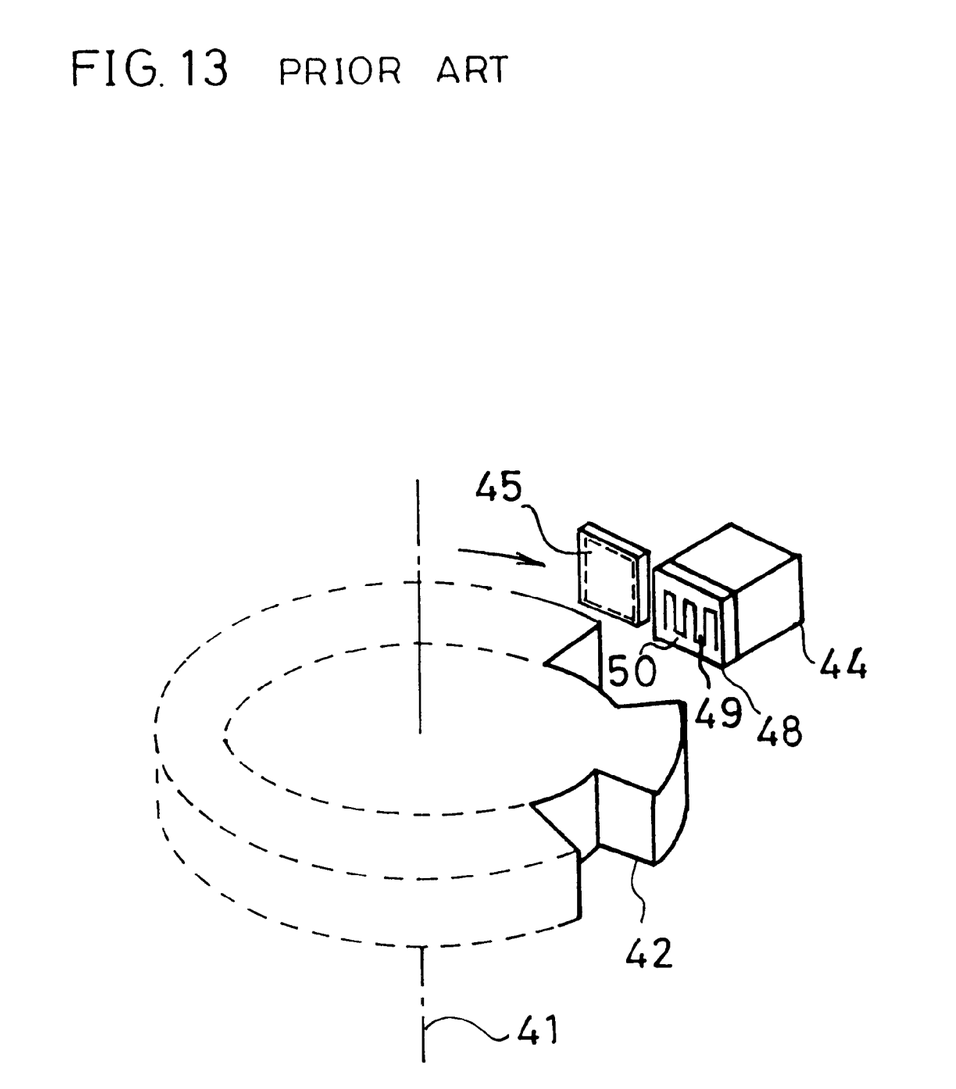
FIG. 13 is a perspective view showing an arrangement of a magnetic detection device using a conventional GMR element.

FIG. 12 and FIG. 13 are a side view and a perspective view, respectively, of a structure of a magnetic detection device using a conventional GMR element.

FIG. 12 and FIG. 13, this magnetic detection device comprises a rotation shaft 41, a disk shaped magnetic rotating body as a means of providing a magnetic field change due to a rotating magnetic field synchronously with the rotation of the rotating shaft 41 and having at least one uneven surface of recess and protrusion on that rotating body, a GMR element 48 which is arranged with a gap of predetermined spacing facing the outer periphery of the magnetic rotating body 42, a magnet 44 as a means for providing a magnetic field to the GMR element 48 and an integrated circuit 45 for processing output of the GMR element 48; and the GMR element 48 has a magnetic resistance pattern 49 as a magnetosensitive pattern and a thin film surface 50.

In the magnetic detection device as above, a magnetic field penetrating through the thin film surface (magnetosensitive surface) 50 of the GMR element 48 changes due to rotation of the magnetic rotating body 42, thereby resistance value of the magnetoresistance pattern 49 changes.

Figure 14:
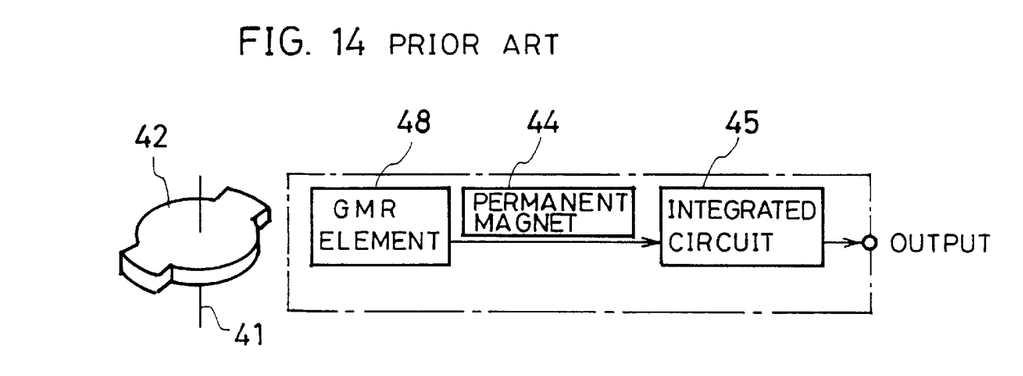
FIG. 14 is a block diagram illustrating a magnetic detection device using a conventional GMR element.
Figure 15:
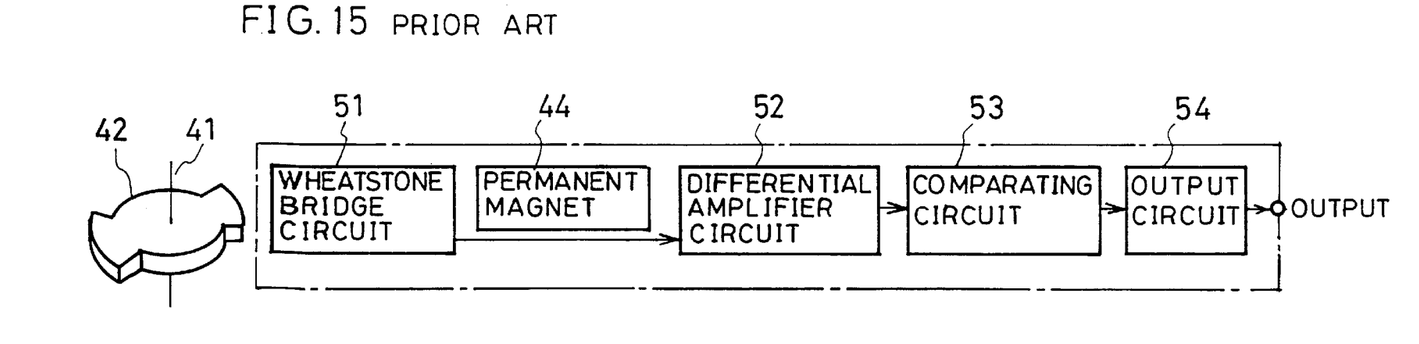
FIG. 15 is a block diagram illustrating a detailed magnetic detection device using a conventional GMR element in detail.

FIG. 14 is a black diagram of a magnetic detection device employing a conventional GMR element, and FIG. 15 is a detailed block diagram of a magnetic detection device employing a conventional GMR element.

A magnetic detection device shown by FIG. 14 and FIG. 15 comprises a Wheatstone bridge circuit using a GMR element 48 which is arranged with a gap having a predetermined distance with a magnetic rotating body 42 and is supplied with a magnetic field from the magnet 44, a differential amplifier circuit 52 for amplifying an output of the Wheatstone bridge circuit 51, a comparator circuit 53 for outputting "0" or "1" signal by comparing this output value of the differential amplifying circuit 52 with a reference value and an output circuit 54 for performing switching upon reception of the output of the comparator circuit 53.

Figure 16:
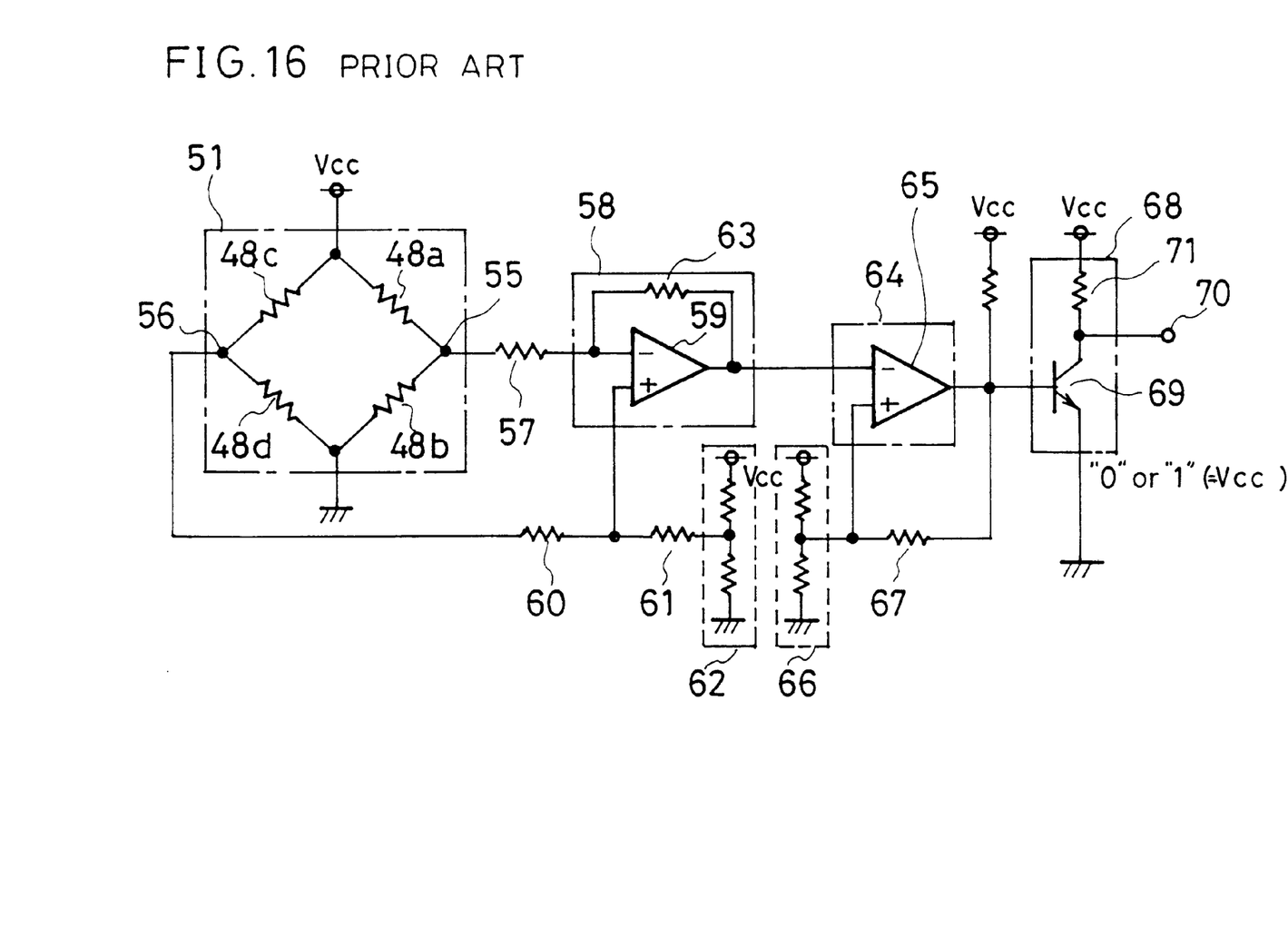
FIG. 16 shows an example of a circuit arrangement of a magnetic detection device using a conventional GMR element.

FIG. 16 shows an example of a circuit arrangement of a magnetic detection device using a conventional GMR element.

FIG. 16, a Wheatstone bridge circuit 51 has, for example, the GMR element 48a, 48b, 48c, and 48d on each side of it; and the GMR element 48a and GMR element 48c are connected to the power supply terminal VCC, the GMR element 48b and the GMR element 48d are grounded, each of the other end of the GMR element 48a and that of the GMR element 48b is connected to a connection point 55 and each of the other and of the GMR element 48c and the GMR element 48d is connected to a connection point 56.

The connection point 55 of the Wheatstone bridge circuit 51 is connected to an inverse input terminal of the amplifier 59 of the differential amplifier circuit 58 through a resistor 57, and the connection point 56 is connected to a non-inverse input terminal of the amplifier 59 through a resistor 60 and further connected to a potential dividing circuit 62 which provides a reference voltage on the basis of the voltage supplied from the power supply terminal VCC.

An output terminal of the amplifier 59 is connected to it's own inverse terminal through a resistor 63 and also is connected to an inverse input terminal of the amplifier 65 of the comparator circuit 64; and a non-inverse input terminal of the amplifier 65 is connected to a potential dividing circuit 66 which provides a reference voltage on the basis of the voltage supplied from the power supply terminal VCC and also is connected to an output terminal of an amplifier 65 through an resister 67.

An output end of the comparator circuit 64 is connected to base of a transistor 69 of the output circuit 68, collector of the transistor 69 is connected to an output terminal 70 of the output circuit 68 and is connected also to the power supply terminal VCC through a resistor 71 and the emitter of this transistor is grounded.

Figure 17:
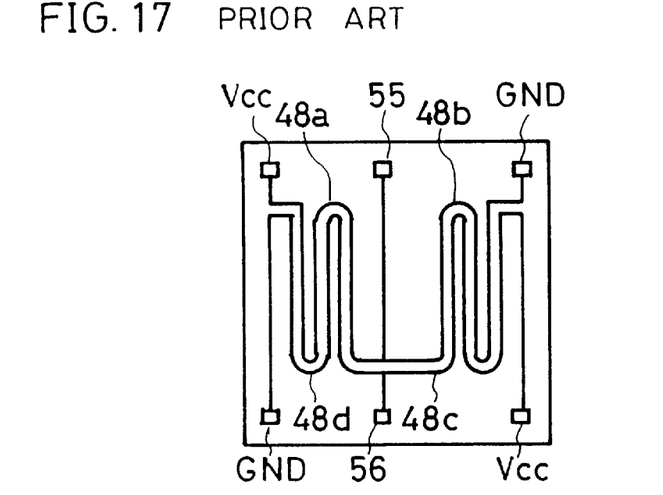
FIG. 17 shows an arrangement of a conventional magnetic detection element.
Figure 18:
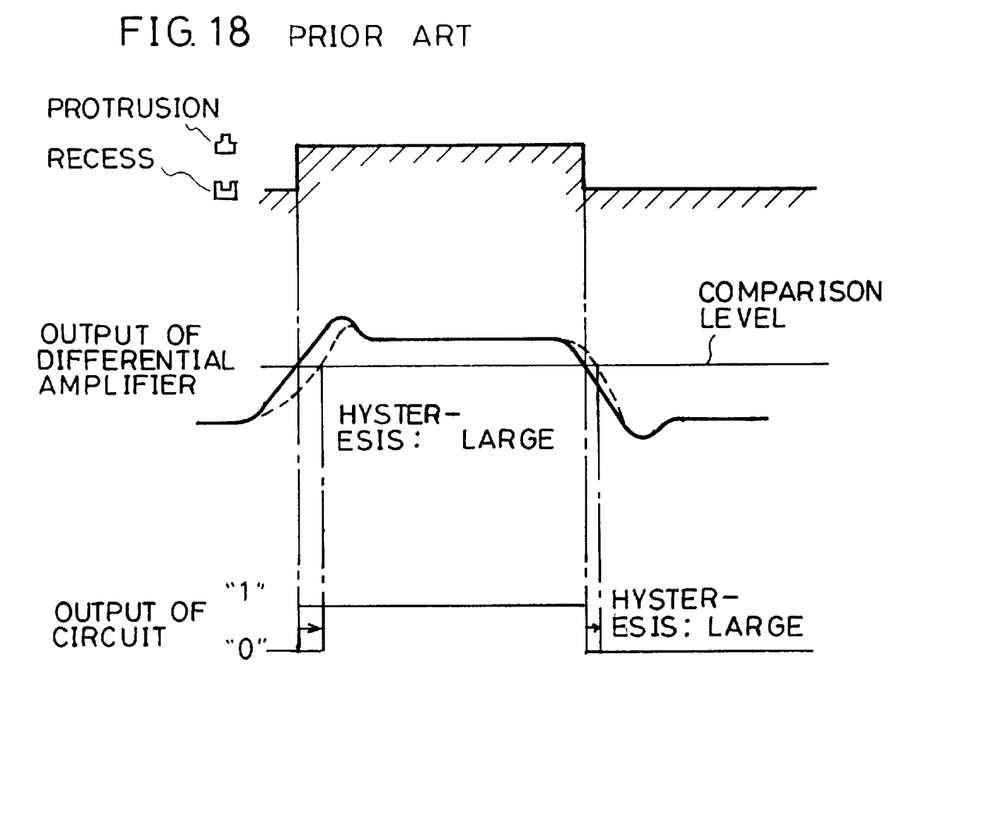
FIG. 18 shows characteristics depicting a performance of a conventional magnetic detection element.

FIG. 17 shows a structure of a conventional magnetic detection element and FIG. 18 shows an operational characteristics of a conventional magnetic detection element.

As shown by FIG. 17, the Wheatstone bridge comprises a GMR element 48 (consisting of 48a~48d) As shown by FIG. 18, as the magnetic rotating body 42 rotates, the magnetic field supplied to the GMR element 48 (48a to 48d) changes and as shown by FIG. 18 an output corresponding to the uneven surface of recess and protrusion of the rotating body 42 can be obtained at the output end of the differential amplifier circuit 58.

This output of the differential amplifier circuit 58 is supplied to the comparator (circuit 64, compared with a reference value, a level to be compared, and converted to a signal of "0" or "1" and this converted signal is further waveform shaped by the output circuit 68 and as a result, signal of "0" or "1" with a sharp rise or fall can be obtained at the output terminal 70 of it as shown by FIG. 18.

Characteristics of the GMR element used for the foregoing magnetic detection element includes, however a hysteresis with respect to applied magnetic field, and this causes reduction of sensitivity when a range of magnetic field set by the magnetic detection device is narrow, and as a result there may be a possibility that practice of detection will encounter difficulties. Since the magnetic characteristics of the GMR element is temperature dependent similar to metal films in general, there may also arise a likelihood of troubles in practice of detection when temperature in operation rises even when the element has sufficient sensitivity in the range of magnetic field set for the magnetic detection device at room temperature.

Therefore, there was a problem such that a possibility of not obtaining a sufficient output signal is expected in the case where a range of magnetic field is extremely small only in a particular portion as exemplified by partially narrowed spacing between a recess and protrusion of the rotating body facing the magnetic detection element.

Also there is problem such that, when an environmental temperature in operation is sever (e.g. higher than −40° C. and lower than 15° C.) as in a case of an automobile application, an output can not be obtained on a high temperature side. Now, for automobile application various way of usage of this element such as rotational speed detection of engine and wheel for engine control and brake control are considered.

Accordingly, the present invention is made in order to solve foregoing problems and object of this invention is to provide a magnetic field detection device having a wide environmental operational temperature range and high detection sensitivity

SUMMARY OF THE INVENTION

According to the present invention, a magnetic detection element comprises a giant magnetoresistance element, the giant magnetoresistance element is operated in a magnetic field which stays within a limit less than a magnetic field obtained by multiplying a saturation magnetic field of the giant magnetoresistance element by 0.8.

In the magnetic detection element according to the present invention, the giant magnetoresistance element is operated in a magnetic field which is larger than a field for maximizing a resistance value of the giant magnetoresistance element.

In the magnetic detection element according to the present invention, the magnetic detection element is provided with an integrated a circuit.

In the magnetic detection element according to the present invention, said giant magnetoresistance element consists of laminated layers with an alternate succession of a layer of Fe(X)Co(1−X)[0≦X≦0.3] and a copper layer, thickness of a single layer of the copper is such that the magnetic resistance change with respect to the thickness of a single copper layer takes a value in the vicinity of a second peak value, and the number of lamination of the layer with a bundle of Fe(X)Co(1−X)[0≦X≦0.3] and Cu layer counted as a single layer is more than ten and less than forty.

In the magnetic detection element according to the present invention, thickness of the layer of Fe(X)Co(1−X) [0≦X≦0.3] is more than 10 Å and less than 30 Å.

In the magnetic detection element according to the present invention, an uppermost layer of the laminated layers consists of said layer of Fe(X)Co(1−X)[0≦X≦0.3].

In the magnetic detection element according to the present invention, a protective layer is formed on the uppermost layer of Fe(X)Co(1−X)[0≦X≦0.3].

In the magnetic detection according to the present invention, a side surface of a resistance pattern which is formed as the giant magnetoresistance element is tapered off to make an angle of more than 20 degrees and less than 80 degrees with respect to a face of a base board for holding the giant magnetoresistance element.

In the magnetic detection element according to the present invention, side surface of a resistance pattern which is formed as the giant magnetoresistance element is tapered off to make an angle of more than 40 degrees and less than 65 degrees with respect to a face of a base board for holding the giant magnetoresistance element.

According to the present invention, the protective layer is formed by means of thin film treatment without releasing the vacuum produced during formation of the upper must layer.

According to the present invention, a magnetic detection device consists of a rotating magnetic body having an unevenly formed surface with recess and protrusion on a periphery thereof and being rotatable on a rotating axis, a magnet which is arranged so as to face said periphery of said rotating magnetic body and a magnetic detection element which is provided at a position at which said magnet faces periphery of said magnetic rotating body, and the magnetic detection element comprises a giant magnetic element which detects variation of magnetic field between the rotating magnetic body and the magnet caused by rotation of the rotating magnetic body and detects amount of rotation of the rotating magnetic body on the basis of result of the detection.

DESCRIPTION OF THE PREFERRED EMBODIMENT

Description of Embodiments of the magnetic detection element, production method of it and the magnetic detection device according to the present invention will be given in detail referring to accompanied drawings.

Embodiment 1

Figure 1:
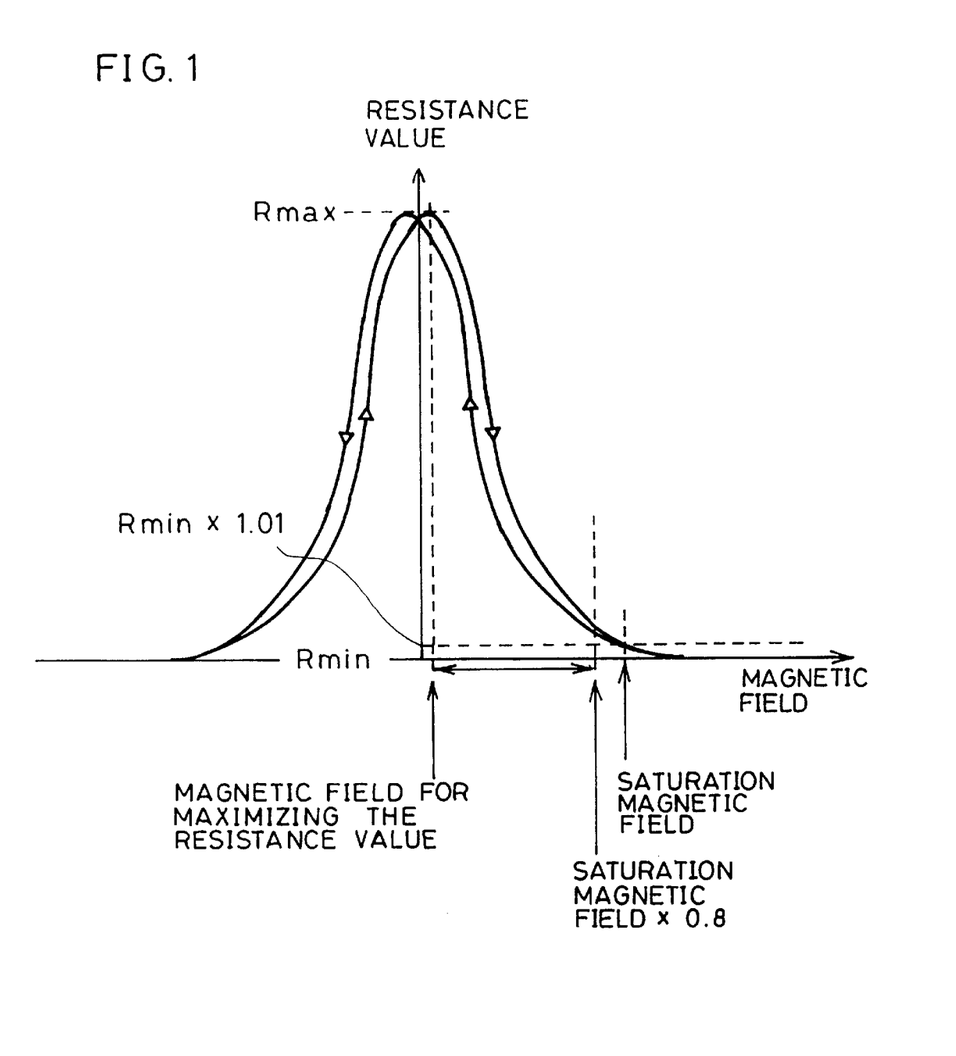
FIG. 1 shows magnetic characteristics of the GMR element used for the magnetic detection element according to the Embodiment 1 of the present invention.

FIG. 1 shows a magnetic characteristics of the magnetic detecting element and the GMR element of which the magnetic detection element is consisted.

As shown by FIG. 1, magnetic field curve depicting the magnetic characteristics of the GMR element according to Embodiment 1 exhibit a maximum value of the resistance (hereinafter referred to as Rmax) in the vicinity of zero magnetic field and the value decreases as the magnetic field increases and assumes a saturated state at a sufficiently large magnetic field (I,g., more than 20 KOe). Now the resistance value under this saturation state is defined as Rmin. On the way of bringing back the magnetic field from the saturated state, the resistance value increases toward the point at zero magnetic field value tracing back different path from the one which is traced during increase of the magnetic field and thus so called hysteresis is exhibited.

Generally speaking, though a saturated magnetic field is meant by a minimum magnetic field which is just enough for bringing that field into saturated state, because of vagueness involved in this definition, in the present invention the saturated magnetic field is defined as "the magnetic field obtained at the intersecting point of the value obtained by adding 1% of Rmin to Rmin (i.e. Rmin×1.01) and the magnetoresistance curve obtained through increase of the magnetic field."

Figure 2:
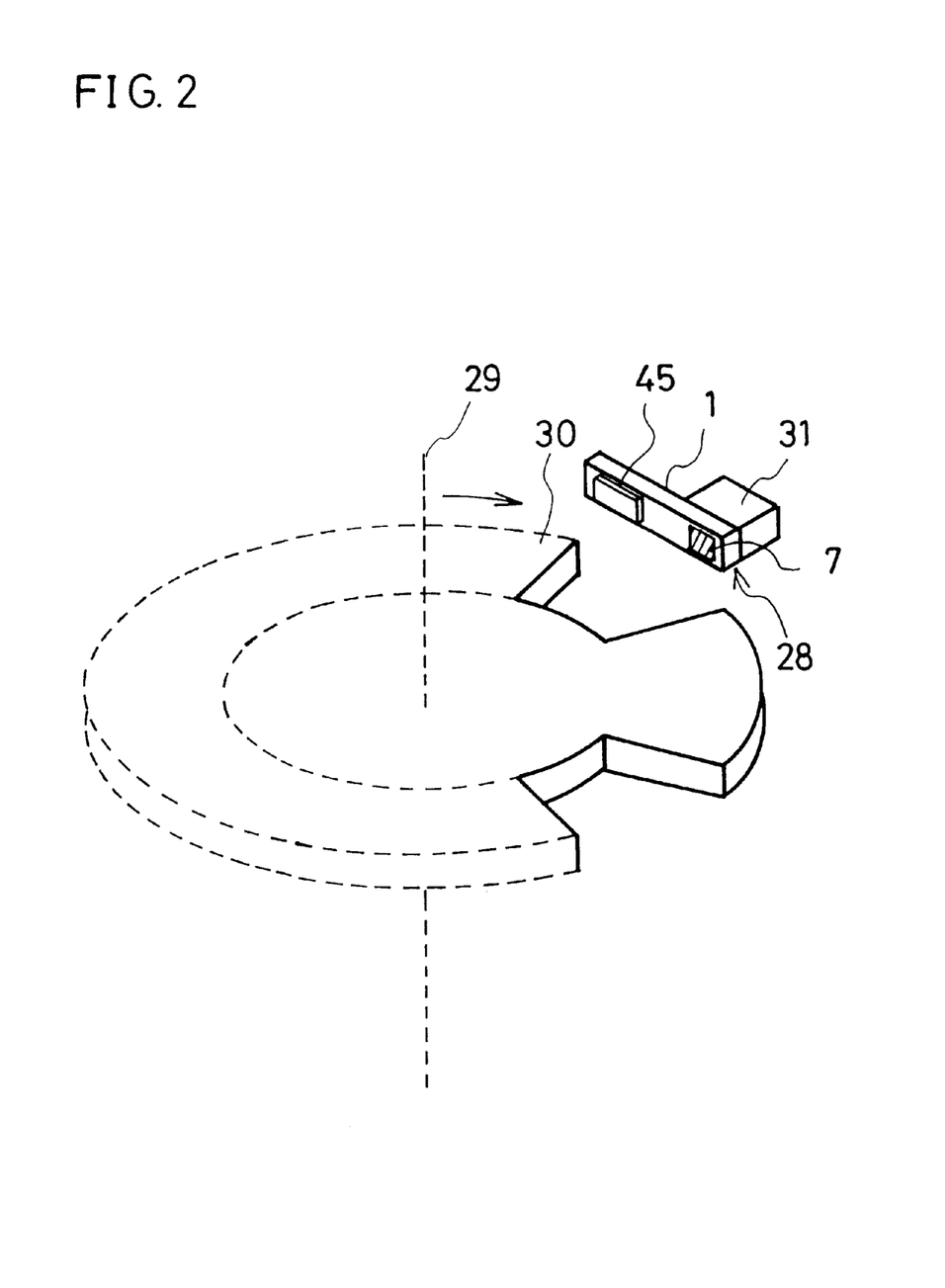
FIG. 2 is a perspective view showing an arrangement of magnetic detection device according to the Embodiment 1.
Figure 3:
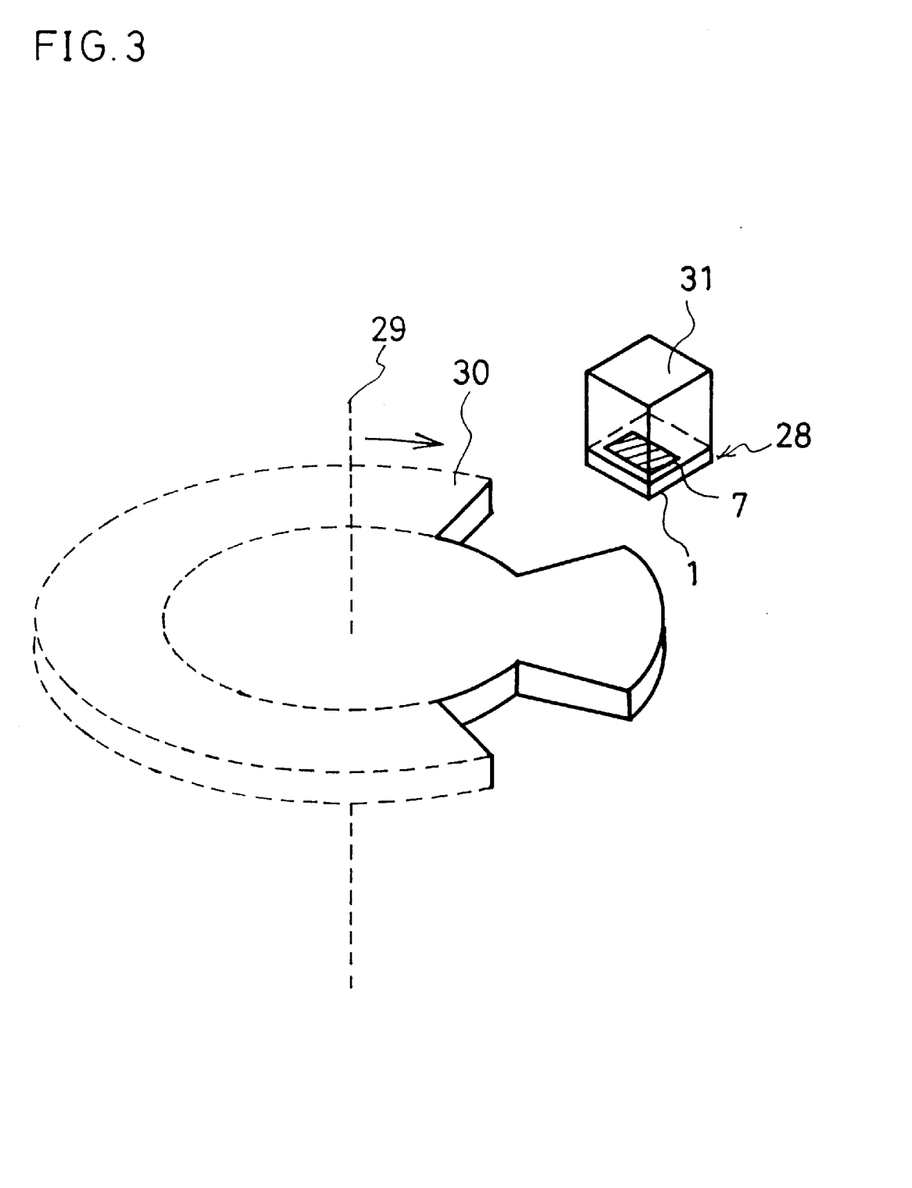
FIG. 3 is a perspective view showing an arrangement of the magnetic detection device according to the Embodiment 1.

As shown by FIG. 2 and FIG. 3, the magnetic detection device comprises the MR element has at least one uneven surface of recess and protrusion on the periphery of it and also comprises a disk shaped magnetic rotating body 30 rotatable synchronously with rotation of the shaft 29, a MR element 28 being arranged so as to face the periphery of the magnetic rotating body 30 with a predetermined spacing of gap facing the magnetic rotating body 30, a magnet 31 for supplying the magnetic field to the GMR element 7 which is provided to the magnetic detection element 28, and an integrated circuit 45 for processing the output of the GMR element 7. Range of magnetic field to be detected by the GMR element 7 can be changed in many ways by adjusting amount of leakage magnetic flux of the magnet 31, distance between the magnet 31 and the GMR element 7 and the distance between the magnetic rotating body 30 and the GMR element 7. By adjusting those factors, the magnetic field to be detected is placed within a range of exceeding the field which is necessary to maximize the resistance value and of falling below the one which is obtained by multiplying the saturated magnetic field by 0.8.

As shown by FIG. 2, the magnetic detection element 28 consists of the GMR element 7 and an integrating circuit 45, which are formed by means of lamination layers treatment technology on the front surface of a substrate 1 such as silicon substrate facing toward periphery of the magnetic rotating body 30. The magnet 31 is mounted on the back face of this magnetic detection element 28 by unshown securing means. According to Embodiment 1 of the present invention, the detection element is operated in the magnetic field such that change of the magnetic field along the magnetic detection at the magnetosensitive face of the GMR element 7 provided on the front surface of the substrate of the magnetic detection element 28 stays in the range of exceeding the magnetic field for maximizing the resistance value of the GMR element 7. Furthermore, the detection is preferably to be performed in a magnetic field which is below the one obtained by multiplying the saturation magnetic field of the GMR element 7 by 0.8, and any arrangement of those elements are acceptable only if conditions just mentioned above are satisfied: for example, as shown by FIG. 3, arrangements are made so that the surface of the GMR element 7 provided on the magnetic detection element 28 is placed nearly perpendicular to the uneven surface of recess and protrusion of the magnetic rotating body 30 and the magnet 31 is arranged immediately above (also possible to be immediately below) the GMR element 7. In this case too, unshown integrated circuit is provided near the GMR element 7.

When range of the magnetic field to be detected by the GMR element 7 is expanded to the region below the magnetic field smaller than field at Rmax, the hysteresis of the magnetic resistance curve in this range of the magnetic field increases; and this produces a disadvantage such that accuracy for detection of edges of the recess and protrusion of the rotating body 30 is reduced and sufficient output can not be obtained in the case where the magnetic field becomes extremely small only in a specific portion such as the space between recess and protrusion of the magnetic rotating body 30 facing the magnetic detection element 28 is partially narrowed.

Generally speaking, since the saturation magnetic fields of the GMR layer decreases as the temperature rises, as the case may be, it is may happen that the magnetic field obtained by multiplying the saturation magnetic field at a room temperature by 0.8 exceeds the saturation magnetic field as the temperature rises. The resistance change rate (%/Oe) in the vicinity of the saturation magnetic field at the room temperature is by nature limited only to a relatively small value, and as the temperature rises, the resistance change rate (%/Oe) further decreases. Because of dependency of output level on the resistance change (%/Oe), lowering of output advances. In this way, there may be a disadvantage such that lowering of output under the operation at high temperature becomes noticeable when the range of magnetic field to be detected by the GMR element 7 is expanded to a range larger than the field obtained by multiplying the saturation magnetic field of the GMR element 7 by 0.8.

The foregoing disadvantage can be overcome by operating the GMR element 7 in the range of magnetic field which exceeds the one at which the resistance value becomes maximum and falls below the one obtained by multiplying the saturation magnetic field of the GMR element 7 by 0.8, and thereby expansion of the range of working temperature and raising the sensitivity will be attained.

Thus, according to Embodiment 1 the detection is performed under the condition that the change of the magnetic field in the direction of detection at the magnetic sensitive face of the GMR element 7 provided on the magnetic field detection element 28 lies in the range which exceeds the field maximizing the resistance of the GMR element 7 and falls below the one obtained multiplying the saturation magnetic field of the GMR element 7 by 0.8 and thus the detection element having a wide range of working temperature and also having high detection sensitivity can be provided. Now, the lower limit below the field obtained by multiplying by 0.8 is described as follows: Suppose "the magnetic field multiplied by 0.81" is denoted provisionally by Hss, in view of lowering output at high temperature operation, the following relation of $-Hss \leq H \leq Hss$ is deemed to be an effective range.
Embodiment 2

Figure 4:
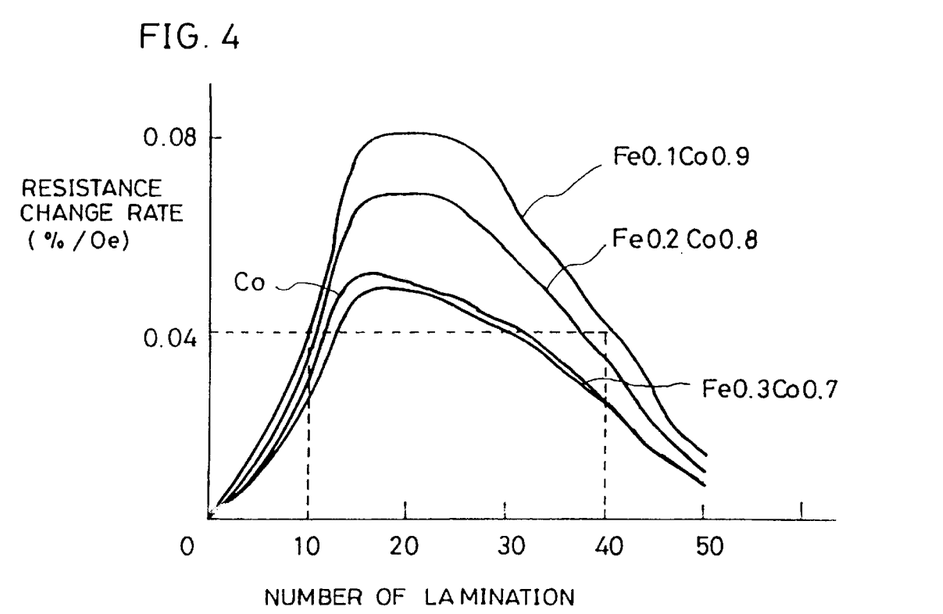
FIG. 4 shows the relation between the resistance change rate per unit magnetic field and number of lamination of the GMR element used for the magnetic detection element according to the Embodiment 2.

FIG. 4 shows relation between resistance change rate per unit magnetic field of the GMR element and the number of lamination layers according to Embodiment 2.

The GMR element 7 as above consists of an alternate successive laminated layers of Fe(x)Co(1−X)[≦x≦0.3] layer and upper layer and FIG. 4 shows the relation between the resistance change rate per unit magnetic field and the number of lamination in the case where, thickness of a single copper layer is chosen so that the magnetic resistance change reaches the vicinity of second peak at that thickness and a lamination consisting of a bundle of a single Fe(x)Co (1−X)[≦x≦0.31] layer and a single copper layer is counted as one lamination. A description will be given on the definition of "a bundle of".

As shown by FIG. 4 a resistance change rate per unit magnetic field (hereinafter referred to as magnetic field sensitivity) takes large value near the lamination number of fifteen to thirty when Fe(x)Co(1−X)[0≦x≦0.3] is used as a magnetic layer and in order to have a sufficient detection sensitivity as an magnetic detection element around at 150° C. it is preferable to choose the lamination number from ten to forty. When the lamination number is less than ten or more than forty, a sufficient magnetic field sensitivity can not be obtained for any sample.

Thus in Embodiment 2, the GMR element 7 consists of laminated layers of alternate succession of Fe(x)Co(1−X) [0≦x≦−0.3] layer and upper layer, thickness of a single copper layer is chosen so that the magnetic resistance change with respect to this thickness takes the value in the vicinity of second peak and also the number of lamination of the Fe(x)Co(1−X)[0≦x≦0.3] layer and copper layer is chosen to be in the range of ten to forty. Therefore, in view of above reason, it is possible to improve the sensitivity of the magnetic detection element 28.
Embodiment 3

Figure 5:
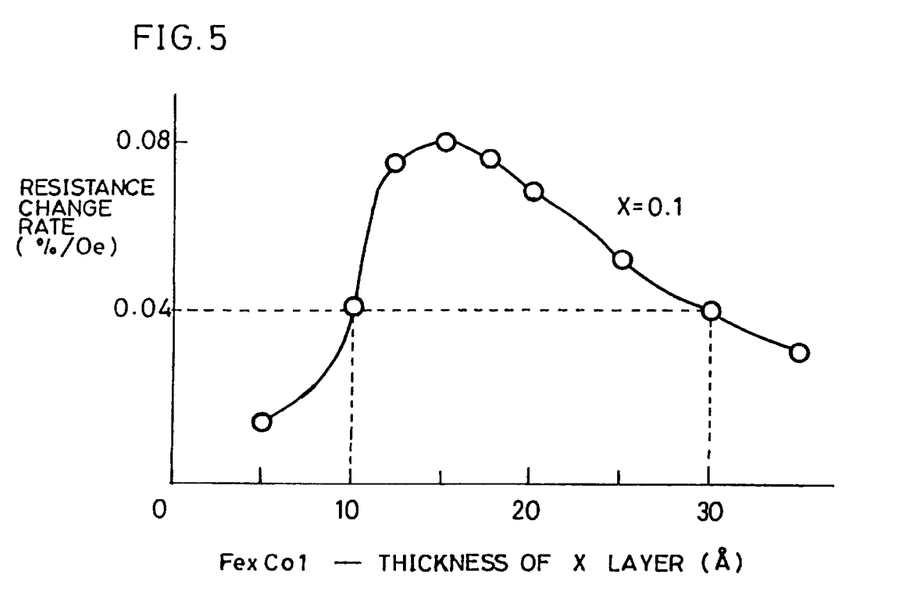
FIG. 5 shows the relation between the resistance change rate per unit magnetic field and the thickness 2; of the FeCo layer of the GMR element used for the magnetic detection element according to the Embodiment 3.

FIG. 5 shows the resistance change rate per unit magnetic field of the GMR element with respect to thickness of the FeCo layer according to Embodiment 3.

FIG. 5 shows the relation of the resistance change rate per unit magnetic field with respect to the thickness of a single Fe0.1Co0.9 layer when the GMR element, which exhibits the best characteristics as shown by FIG. 4, consists of laminated layers of an alternate succession of Fe(x)Co(1−X)[x=0.1] layer and copper layer in which the magnetic resistance change with respect to the thickness of a single copper layer takes a value near the second peak.

The resistance change rate per unit magnetic field as shown by FIG. 5 rises suddenly from the thickness of near 10 Å and exhibits sufficiently large values from 12 Å to near 20 Å and beyond 30 Å sufficient magnetic field sensitivity can not be obtained.

Accordingly, it is preferable to form the GMR element 7 choosing the thickness of a single FeCo layer to be in a range of 10 Å to 30 Å.

As aforementioned in Embodiment 3, the GMR element consists of laminated layers of an alternate succession of a Fe(x)Co(1−x)[x≦0.3] and a copper layer and thickness of a Fe(x)Co(1−X)[≦x≦0.31] layer is chosen to be in range of 10 Å to 30 Å when thickness of a single copper layer is chosen so that the magnetic resistance change with respect to the thickness of copper layer becomes near the second peak. Therefore, in view of foregoing reason, it is possible to improve the sensitivity of the magnetic detection element 28.
Embodiment 4

Figure 6:
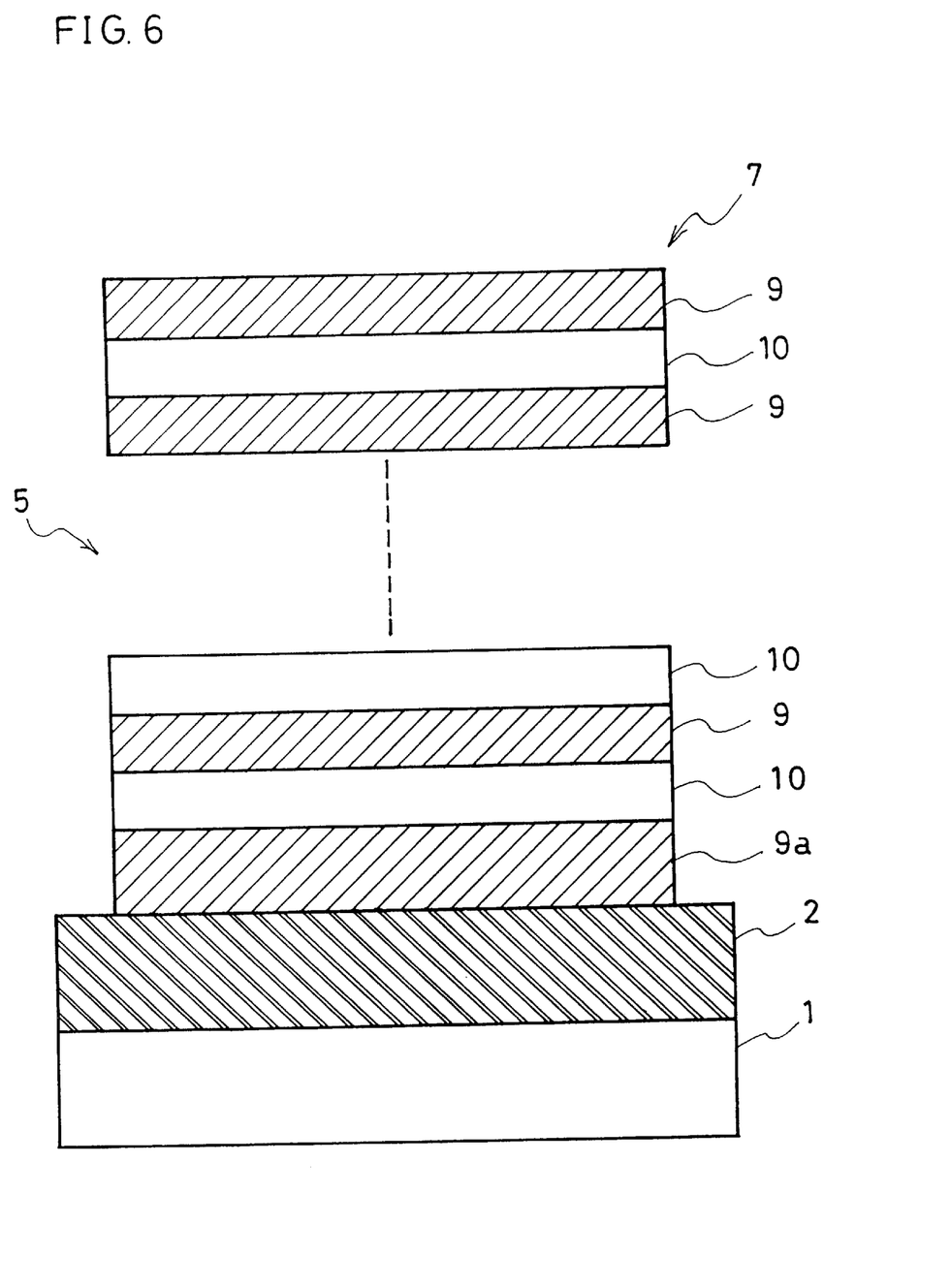
FIG. 6 is a sectional view showing a formation the layer of the GMR element used for the magnetic detection element according to the Embodiment 4.
Figure 7:
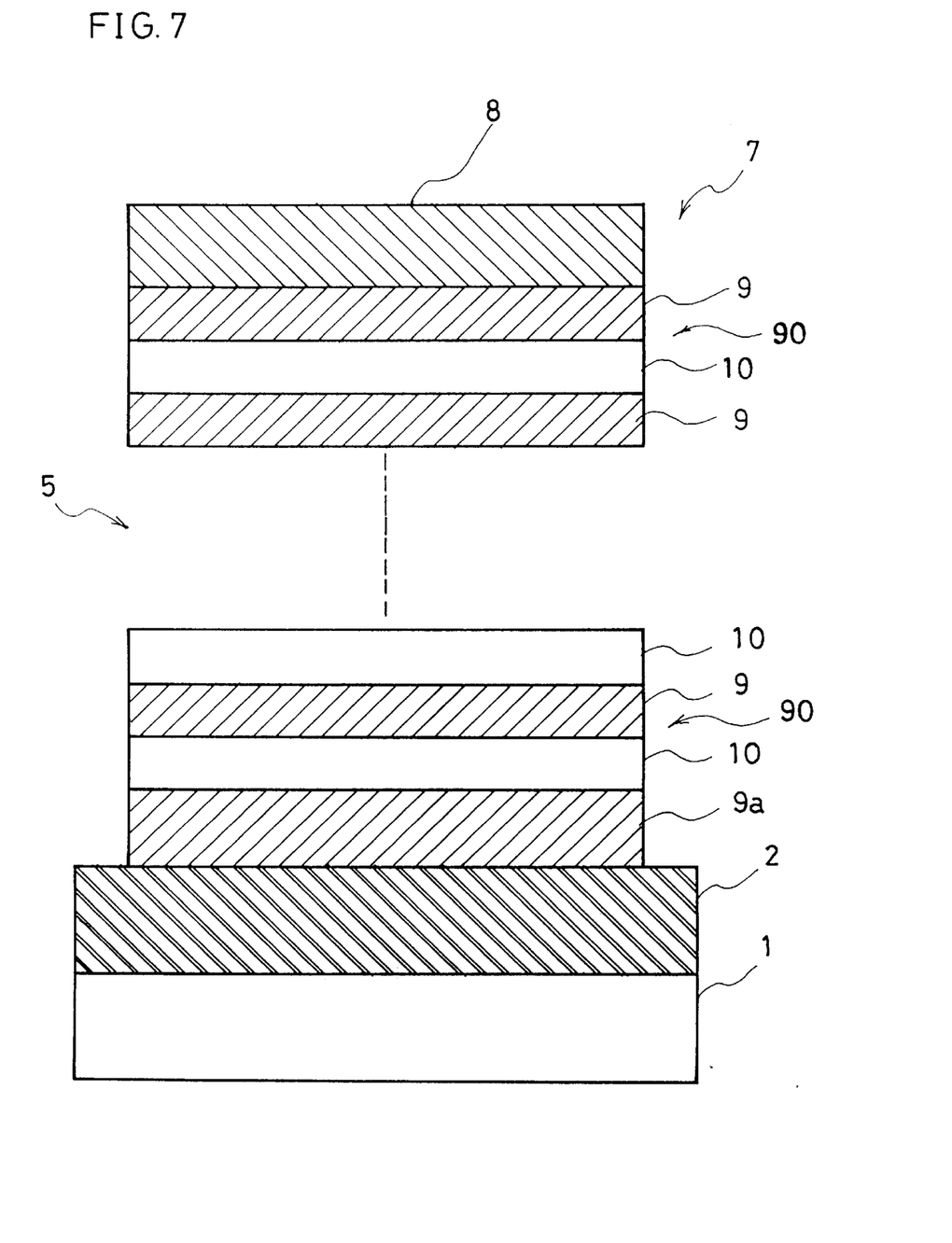
FIG. 7 is a sectional view showing a formation of the layers of the GMR element used for the magnetic detection element according to Embodiment 4.

FIG. 6 and FIG. 7 show formation of layer of the GMR element according to the Embodiment 4 of the present invention.

As shown by FIG. 6, on the process of forming the layer 5 of the GMR element, for example, after the formation of the layer 9a of FeCo layer on the surface of the base layer 2 such as thermal oxidation layer of silicone formed on the substrate 1 such as silicone substrate, Copper layer 10, Fe(x)Co(1−X)[0≦x0.3] layer 9, Cu layer 10, FeCo layer 9 are successively formed on that FeCo layer 9a. Paired layers of FeCo Layer 9 with Cu layer 10 is laminated ten times to forty times to end up with the upper most layer to be the FeCo layer 9. Suppose that the uppermost layer is Co layer consisting of material having higher electric conductance than that of FeCo layer 9, probability of flowing of electrons, which do not contribute to the GMR effect, through near the surface rises and as a result magnetic resistance change rate (MR rates) will be reduced; and thus the uppermost layer is preferably formed by FeCo layer 9 as shown by FIG. 6.

As shown by FIG. 7, by successively forming further a SiNx layer as a protective layer on the uppermost layer of the FeCo layer 9, the GMR element 5 is protected from oxidation during processes to be followed such as photolithographic process, thereby characteristics of element 7 can be stabilized. The SiNx layer as a protective layer can be formed successively without releasing the vacuum after the formation of the uppermost FeCo layer 9; in other words, by preparing laminated layers of GMR element layer 5 (laminated layers) by repetition of Fe(x)Co(1−X)[≦x≦0.3] layer 9 and Copper layer 10 and by forming the protective layer 8 on the uppermost layer of the GMR element layers 5, production of GMR element can be made; after forming the uppermost layer by means of thin film technology such as spattering, low temperature plasma CVD and vacuum deposition, without releasing the vacuum the protective layer too can be formed by means of the thin film technology.

By virtue of this process, natural oxidation acted on the GMR element layers 5 can be suppressed and works effectively further on improvement of stabilization.

In place of SiNx layer, as protective layer, besides dielectric layers such as oxide Si layer and oxide Ta layer, metal layer of Ti, V, Ta, Nb, Zr, etc., combined metal layer of them, oxide layer and nitride layer of them can be used. Any of them can be formed by means of spattering, low temperature plasma CVD and vacuum deposition without detriment to the characteristics of the GMR element layers 5.

In this way in Embodiment 4 of the present invention the upper most layer of the GMR element layers 5 is formed by FeCo layer 9, and thus the magnetic characteristics of the GMR element 7 can be improved and also the reliability of the GMR element 7 can be improved by virtue of forming the protective layer 8 after formation of the GMR element layers 5.

Now, descriptions will be given on the definition of term "a bundle of". As to the layer of which the laminated layers are consisted as shown by FIG. 6 and FIG. 7, layer 9 and layer 10 are FeCo layer and Cu layer, respectively, and starting from the substrate 1, in a succession of substrate 1/foundation layer 2/lowermost positioned FeCo layer 9/[Cu layer 10/FeCo layer 9]/[Cu layer 10/FeCo layer 9]/[Cu layer 10/F FeCo layer 9]/... [Cu layer 10/FeCo layer 9], i.e. in the repetition of pained layer 90 of [Cu layer 10/FeCo layer 9], the laminated layers are formed. The term "a bundle of" is meant by the paired layer 90 of Cu layer 10/FeCo layer 91. This paired layer also can be regarded as a paired layer other than the first occuring FeCo layer.

This laminated formation can be expressed briefly as lowermost FeCo layer 9a/[Cu layer 10/FeCo layer 9]×n (number of bundles is n), and this n is defined as the number of lamination.

In this instance, the lowermost layer FeCo 9 is not necessarily required and yet used because presence of this layer enable to proceed a stable production. Referring only to the formation of [Cu layer 10/FeCo layer 9]×n, paired layer Cu 10 and FeCo 9 is called as "a bundle".

Embodiment 5

Figure 8A:
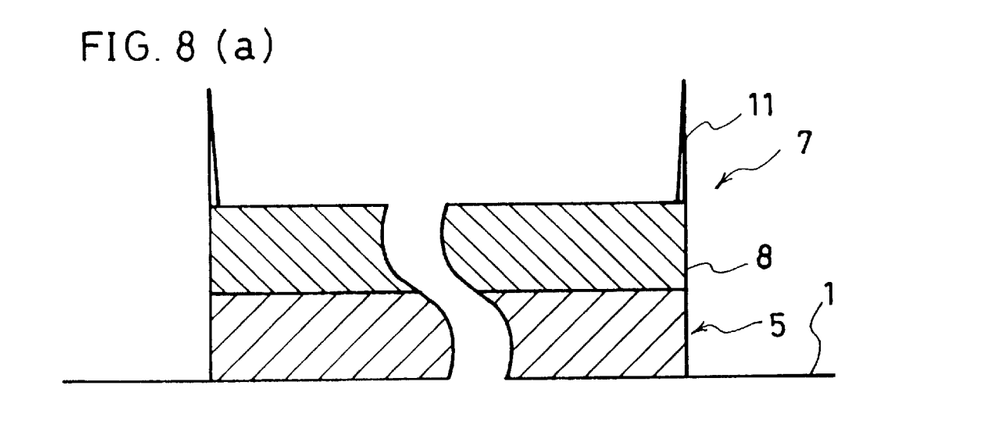
FIG. 8(a) and FIG. 8(b) are sectional views of a side surface of the GMR element used for the magnetic detection element according to the Embodiment 5.
Figure 8B:
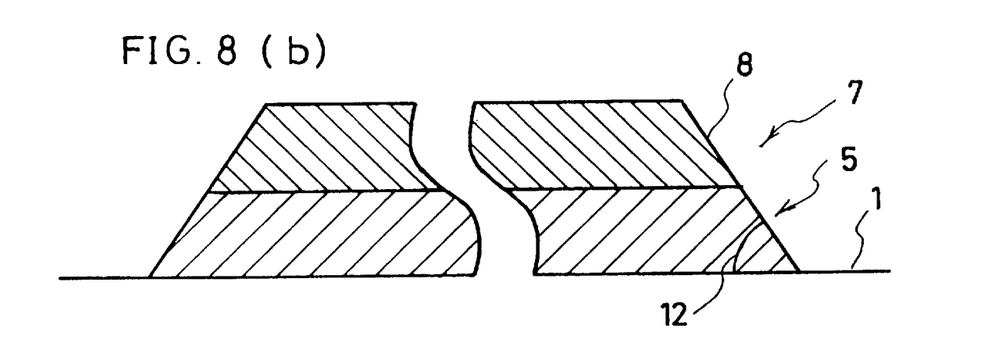

FIG. 8(a) and (b) are sectional views showing formation of layers when the GMR element 7 is configured to pattern according to the Embodiment 5 of the present invention.

The GMR element 7 is formed by configuring the GMR element 5 into a pattern consisting of n times laminations of the paired layer 90. When this pattern formation of the GMR element 5 is proceeded, on the protective layer 8 formed on the GMR element 5, pattern of the element is transcribed on to the resist by means of photolithography, perform etching using the ion beam etching IBE and finally remove the resist.

FIG. 8(a) is a sectional view of the GMR element 7 in which the resist pattern is already removed after the etching with the zero incident angle of the ion beam with respect to the substrate 1 is already finished; in this instance, film 11 which is formed through re-adhering of the resist pattern to the side surface is left as a projection along longitudinal direction and this projection becomes an obstacle against final formation of the protection layer aiming protection of the side surface of the GMR layer 5.

Contrary to the above instance, FIG. 8(b) is a sectional view of the GMR element 7 in which the resist pattern is removed after etching by irradiation of ion beam with some angle with respect to the substrate 1. In this case there exist no residue of re-adhered film 11 which appears in FIG. 8(a) and also the side surface can be tapered and thus coverage in the process of final protective layer formation can be improved. In the case tapering with angle 12 of less than 20° or more than 80° will bear sufficient effect. But in view of accuracy of pattern width, or in the case where diminishing of pattern width or diminishing of pattern spacing is desired, the angle more than 40° is more preferable; and further the angle less than 65° is more preferable in view of mass production with regard to bring the probability of the residue of the re-adhered film 11 to almost zero.

In this way the pattern of the GMR element 7 of Embodiment 5 is provided with a cone angle 12 of more than 20° and less than 80° or more preferably an angle of more than 45° and less than 65°, and thus reliability of the GMR element 7 can be improved.

Though up to now descriptions are given on the formation of the GMR element 7 on the substrate 1 using lamination layer treatment technology, the GMR element 7, which is already formed on a separate substrate, can be bonded on the substrate 1 by means of an adhesive, too.

According to the invention, since the magnetic detection element comprises a GMR element and this GMR element is operated in a magnetic field less than the one which is obtained by multiplying the saturation magnetic field by 0.8, the sensitivity of the magnetic detection element can be improved and also expansion of range of work temperature can be attained.

According to the invention, since the GMR element is operated in a magnetic field larger than the one for maximizing the resistance of the GMR element, the sensitivity can be improved further and the expansion of working temperature range can be attained.

According to the invention, since the magnetic detection element is provided on the laminated layers circuit, extra supporting members to support the integrated circuit is no longer required.

According to the invention, since the GMR clement consists of alternate succession of Fe(x)Co(1−X)[0≦x≦0.3] layer and Cu layer, thickness of Cu layer is chosen so that the magnetic resistance change with respect to the thickness of a single Cu layer takes near the second peak, and the number of lamination of layers lie in the range of more than 10 and less than 40 with a bundle of Fe(x)Co(1-X) [0≦x≦0.3] layer and Cu layer being counted as one lamination, a magnetic detection element having a good magnetic characteristic and high detection sensitivity can be obtained.

According to the invention, since the thickness of the Fe(x)Co(1-X)[0≦x≦0.3] layer is more than 10 Å and less than 30 Å, a magnetic detection element having a good magnetic characteristic and a high sensitivity can be obtained.

According to the invention, since the uppermost layer is the Fe(x)Co(1-x)[0≦x≦0.3] layer, a GMR having a good magnetic characteristics can be obtained.

According to the invention, since a protective layer is formed on the uppermost layer of Fe(x)Co(1-X)[0≦x≦0.3], the reliability of the MR element can be improved.

According to the invention, since the side surface of the resistance pattern formed as the GMR element is tapered off with an angle of more than 20° and less than 80° with respect to surface of the substrate, the final protective layer can be formed in a stabilized manner and reliability of the magnetic detection element can be improved.

According to the invention, since the side surface of the resistance pattern formed as the GMR element is tapered off with an angle of more than 40° and less than 65° with respect to the surface of the substrate, the final protective layer can be formed in a further stabilized manner and reliability of the magnetic detection element can be further improved.

According to the invention, since after forming the lamination layer, the protective layer is formed without releasing the vacuum, reliability of the MR clement can be improved.

According to the invention, since the magnetic element consists of a magnetic rotating body having an uneven surface of recess and protrusion along its periphery and being rotatable on a shaft, a magnet being arranged facing the periphery of the magnetic rotating body and a magnetic detection element being provided at a position facing periphery of the magnetic rotary body, and also since the magnetic detection element consists of the aforementioned GMR element, it is possible to detect, in a wide temperature range for example from 40° C. to 150° C., change of the magnetic field between the magnetic rotating body and the magnet due to the rotation of the magnetic body and also since amount of rotation of the magnetic rotating body is detected on the basis of the result of detection, a magnetic detection clement having a high sensitivity and operable in a wide range of working temperature can be provided.

What is claimed is:

1. A rotation sensor comprising a permanent magnet, a giant magnetoresistance element, and an integrated circuit, wherein said magnetoresistance element detects variation of a magnetic field caused by rotation of a rotating magnetic gear and said integrated circuit processes operations based on the detected variation of the magnetic field, wherein the magnetic field being applied to said giant magnetoresistance element is larger than a maximizing resistance field but less in value than a magnetic field obtained by multiplying a saturation magnetic field of said giant magnetoresistance element by 0.8, wherein said maximizing resistance field is defined as a magnetic field produced when maximizing a resistance value of said giant magnetoresistance element.

2. The rotation sensor according to claim 1, wherein said giant magnetoresistance element consists of laminated layers with an alternate succession of a layer of Fe(x)Co(1-X) [0≦x≦0.3] and a copper layer, thickness of a single layer of said copper is such that the magnetic resistance change with respect to said thickness of a single copper layer takes a value in the vicinity of a second peak value, and the number of lamination of said layers is more than ten and less than forty, wherein the combination consisting of one layer of Fe(x)Co(1-X)[0≦x≦0.3] and one copper layer is counted as one lamination.

3. The rotation sensor according to claim 2, wherein thickness of said layer of Fe(x)Co(1-X)[0≦x≦0.3] is more than 10 Å and less the 30 Å.

4. The rotation sensor according to claim 2, wherein an uppermost layer of said laminated layers consist of said layer of Fe(x)Co(1-X)[0≦x≦0.3].

5. The rotation sensor according to claim 4, wherein a protective layer is formed on said uppermost layer of Fe(x)Co(1-X)[0≦x≦0.3].

6. The rotation sensor according to claim 5, wherein after forming said uppermost layer, said protective layer is formed without releasing a vacuum.

7. The rotation sensor according to claim 1, wherein a side surface of a resistance pattern which is formed as said giant magnetoresistance element is tapered to make an angle of more than 20 degrees and less than 80 degrees with respect to a face of a base board for holding said giant magnetoresistance element.

8. The rotation sensor according to claim 7, wherein a side surface of a resistance pattern which is formed as said giant magnetoresistance element is tapered to make an angle of more than 40 degrees and less than 65 degrees with respect to a face of a base board for holding said giant magnetoresistance element.

* * * * *